(12) United States Patent
Chen

(10) Patent No.: US 8,792,228 B2
(45) Date of Patent: Jul. 29, 2014

(54) BEZEL ASSEMBLY FOR ELECTRONIC DEVICE

(75) Inventor: Yun-Lung Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 90 days.

(21) Appl. No.: 13/448,503

(22) Filed: Apr. 17, 2012

(65) Prior Publication Data

US 2013/0058047 A1    Mar. 7, 2013

(30) Foreign Application Priority Data

Sep. 2, 2011 (CN) .......................... 2011 1 0258024

(51) Int. Cl.
*G06F 1/16* (2006.01)
*H05K 5/00* (2006.01)
*H05K 7/00* (2006.01)

(52) U.S. Cl.
USPC ............... 361/679.02; 361/679.01; 361/679.4

(58) Field of Classification Search
USPC ............... 361/679.01, 379.02, 679.4, 679.43, 361/679.58, 679.6
See application file for complete search history.

(56) References Cited

U.S. PATENT DOCUMENTS

| | | | | |
|---|---|---|---|---|
| 5,465,191 A * | 11/1995 | Nomura et al. | .......... | 361/679.27 |
| 6,102,501 A * | 8/2000 | Chen et al. | .......... | 312/223.2 |
| 6,288,333 B1 * | 9/2001 | Liu et al. | .......... | 174/563 |
| 6,296,334 B1 * | 10/2001 | Liao | .......... | 312/223.2 |
| 6,356,436 B1 * | 3/2002 | Buican et al. | .......... | 361/679.58 |
| 6,555,747 B2 * | 4/2003 | Chen et al. | .......... | 174/559 |
| 6,637,847 B2 * | 10/2003 | Crisp et al. | .......... | 312/223.2 |
| 6,671,179 B2 * | 12/2003 | Chen | .......... | 361/725 |
| 6,899,407 B1 * | 5/2005 | Lai | .......... | 312/223.2 |
| 7,326,868 B2 * | 2/2008 | Chen et al. | .......... | 200/296 |
| 7,377,602 B2 * | 5/2008 | Chen et al. | .......... | 312/223.2 |
| 7,404,610 B2 * | 7/2008 | Smith et al. | .......... | 312/223.2 |
| 7,634,782 B2 * | 12/2009 | Ng et al. | .......... | 720/657 |
| 7,726,850 B2 * | 6/2010 | Chen et al. | .......... | 362/341 |
| 7,796,396 B2 * | 9/2010 | Hanson | .......... | 361/726 |
| 7,815,228 B2 * | 10/2010 | Grunow et al. | .......... | 292/163 |
| 7,968,795 B2 * | 6/2011 | Yang | .......... | 174/67 |
| 7,974,092 B2 * | 7/2011 | Zhang | .......... | 361/679.58 |
| 8,511,633 B2 * | 8/2013 | Hulick et al. | .......... | 248/346.04 |
| 2003/0210529 A1 * | 11/2003 | Chen | .......... | 361/725 |
| 2004/0252449 A1 * | 12/2004 | Lee | .......... | 361/683 |

* cited by examiner

*Primary Examiner* — Lisa Lea Edmonds
*Assistant Examiner* — Keith Depew
(74) *Attorney, Agent, or Firm* — Novak Druce Connolly Bove + Quigg LLP

(57) ABSTRACT

A bezel assembly includes a panel, a shielding member, and a securing member. The panel includes a main body. The main body includes a receiving portion and defines a through hole. The shielding member includes a mounting portion. The securing member includes a resilient arm abutting the receiving portion. The mounting portion extends through the through hole and is engaged with the securing member, to secure the shielding member to the panel; when the shielding member is disengaged from the panel, the securing member is moved in a first direction substantially parallel to the main body, the resilient arm is deformed by the receiving portion, the mounting portion is moved in a second direction substantially perpendicular to the first direction so as to be disengaged from the securing member.

16 Claims, 5 Drawing Sheets

BEZEL ASSEMBLY FOR ELECTRONIC DEVICE

BACKGROUND

1. Technical Field

The present disclosure relates to electronic device enclosures, more particularly to a bezel assembly.

2. Description of Related Art

A panel of a computer case may include an opening for an optical disk drive to move in or out of the computer case. A decorating plate and a shielding plate may be used to shield the opening. The decorating plate may be secured to an interior of the shielding plate using clipping members. When the shielding plate needs to be maintained or disassembled, the clipping members are disengaged from the decorating plate after the decorating plate is disengaged from the computer case. The above described disassembling processes may be laborious and time consuming. Therefore, an improved bezel assembly may be desired within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
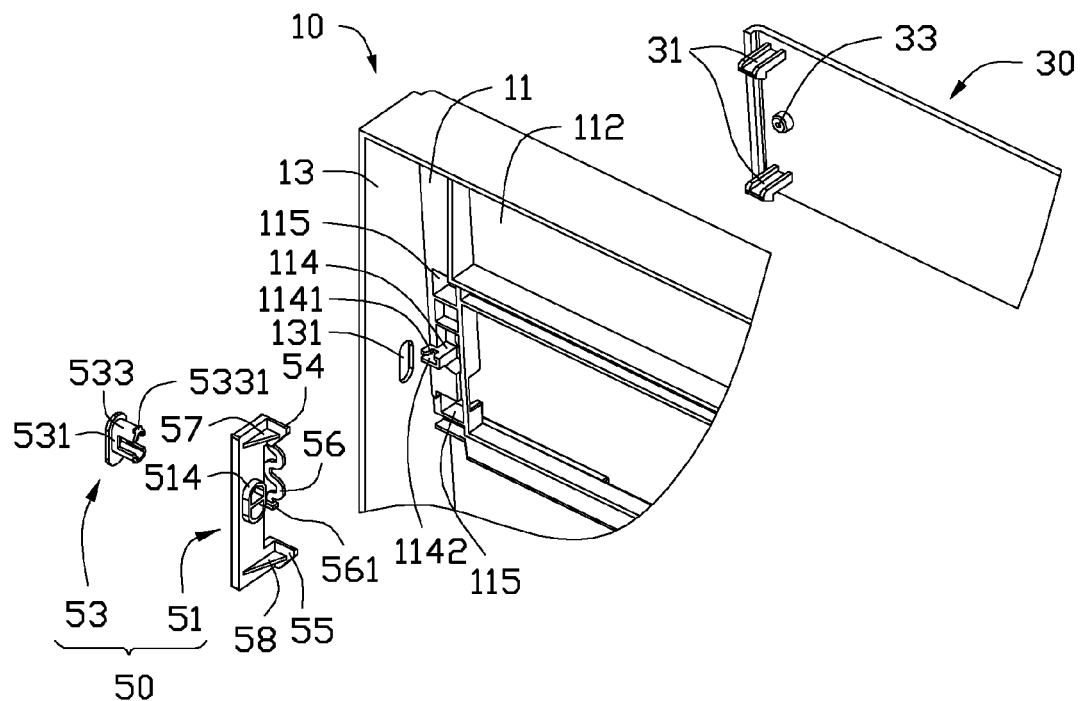
FIG. 1 is an exploded, cutaway view of a bezel assembly in accordance with an embodiment.
Figure 2:
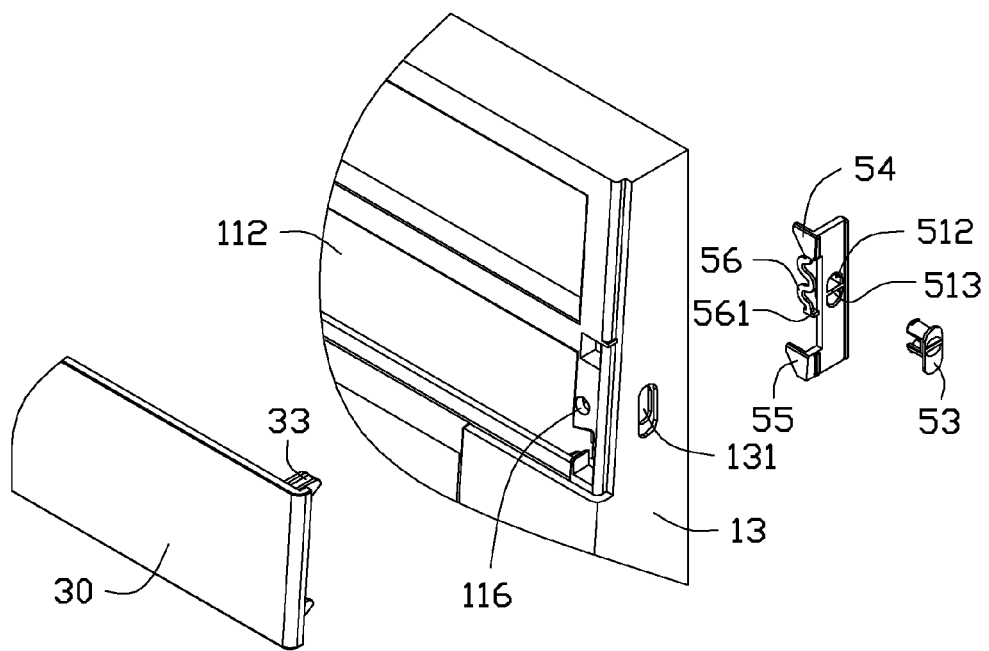
FIG. 2 is similar to FIG. 1, but showing in a different aspect.

FIGS. 1 and 2 show a bezel assembly in accordance with an embodiment including a panel 10, a shielding member 30, and a securing member 50 attached to the panel 10. In one embodiment, the panel 10 is a decorating panel of a computer case.

The panel 10 includes a main body 11 and a flange 13 extending from an edge of the main body 11. In one embodiment, the flange 13 is substantially perpendicular to the main body 11. The main body 11 defines an opening 112 for receiving an optical disk drive, and a receiving portion 114 is located on the main body 11 and adjacent to the opening 112. In one embodiment, a gap is defined between the receiving portion 114 and the flange 13. The receiving portion 114 defines a cutout 1141 and a receiving slot 1142 communicating with the cutout 1141. Two through holes 115, located on opposite sides of the receiving portion 114, are defined in the main body 11. A positioning hole 116, adjacent to the receiving portion 114, is defined in the main body 11. The flange 13 defines a retaining hole 131.

The shielding member 30 includes two mounting portions 31 and a positioning post 33 located between the two mounting portions 31. In one embodiment, each of the two mounting portions 31 is a hook, and substantially perpendicular to the shielding member 30.

Figure 3:
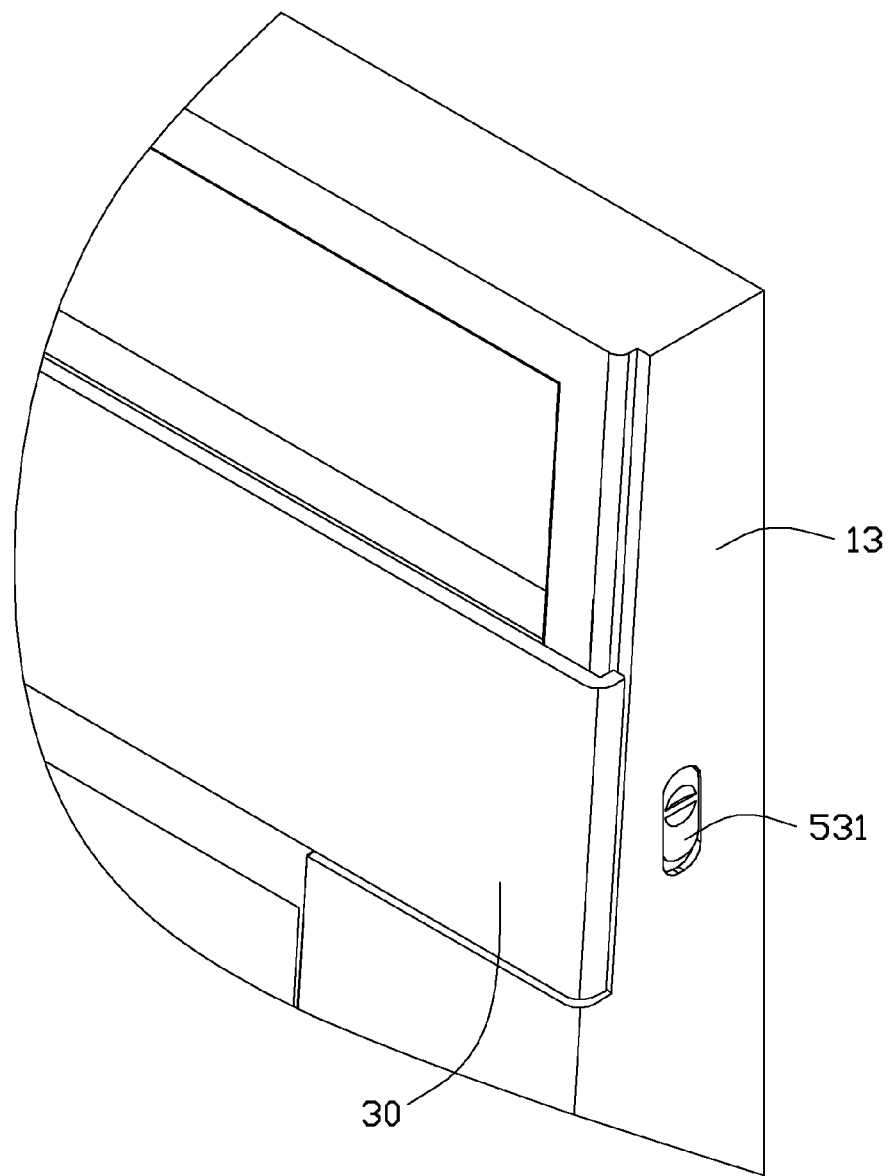
FIG. 3 is an assembled view of the items in FIG. 2.

Referring to FIG. 3, the securing member 50 includes a securing panel 51 and an operating portion 53 attached to the securing panel 51. A first connecting panel 54 extends from a first end of the securing panel 51, and a second connecting panel 55 extends from a second end of the securing panel 51. In one embodiment, a cross-section of the first connecting panel 54 is triangular, and a cross-section of the second connecting panel 55 is also triangular. A resilient arm 56 extends from the first connecting panel 54 in a direction substantially parallel to the securing panel 51. The resilient arm 56 is towards the second connecting panel 55, and a fixing block 561 extends from a free end of the resilient arm 56. In one embodiment, the resilient arm 56 is crooked, and may be a compression spring. A first strengthening rib 57 is located between the first connecting panel 54 and the securing panel 51, and a second strengthening rib 58 is located between the second connecting panel 55 and the securing panel 51. A fixing hole 512 is defined in the securing panel 51, and a separating portion 513 is located in the fixing hole 512. The fixing hole 512 is divided into two parts by the separating portion 513. In one embodiment, a clipping portion 514 is located on an inner surface of the securing panel 51 and surrounds the fixing hole 512.

The operating portion 53 includes an operating panel 531 and two clipping pieces 533 extending from the operating panel 531. The two clipping pieces 533 can be slidably received in the fixing hole 512, and a block 5331 extends from an end of each of the two clipping pieces 533.

Figure 4:
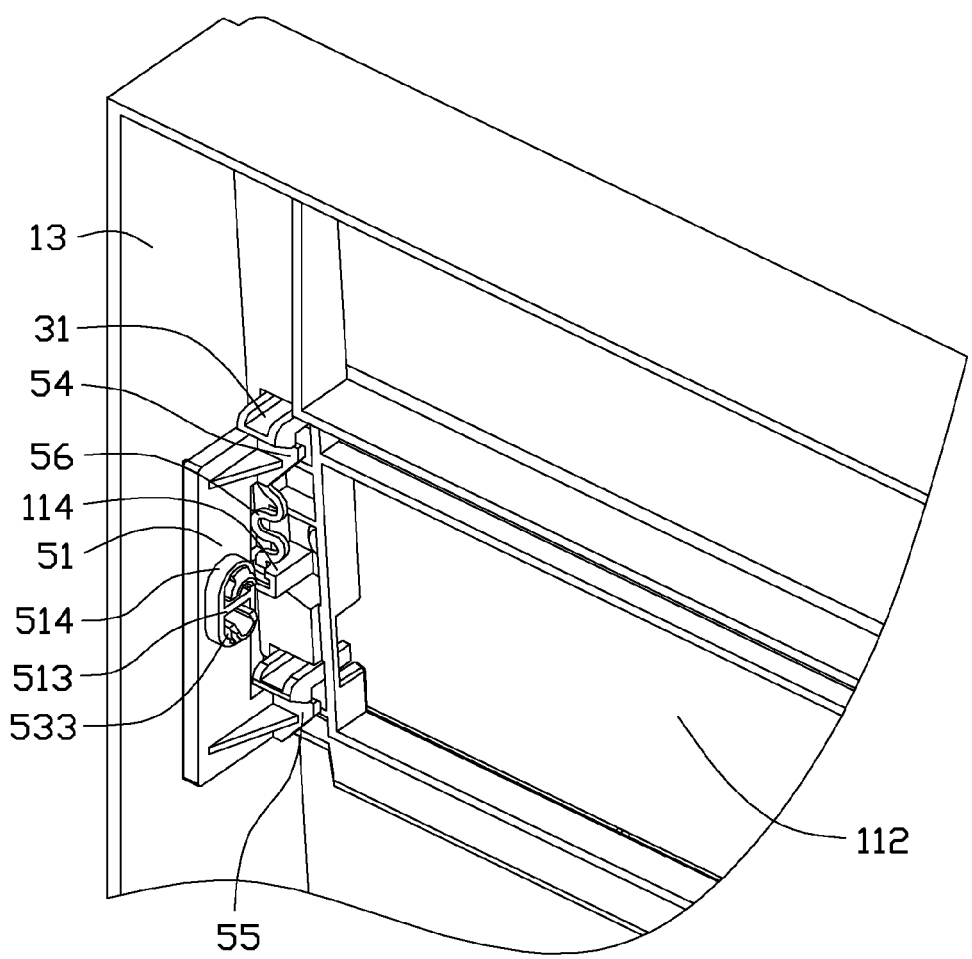
FIG. 4 is an assembled view of the items in FIG. 1, and a securing member of the bezel assembly is located in a first position.
Figure 5:
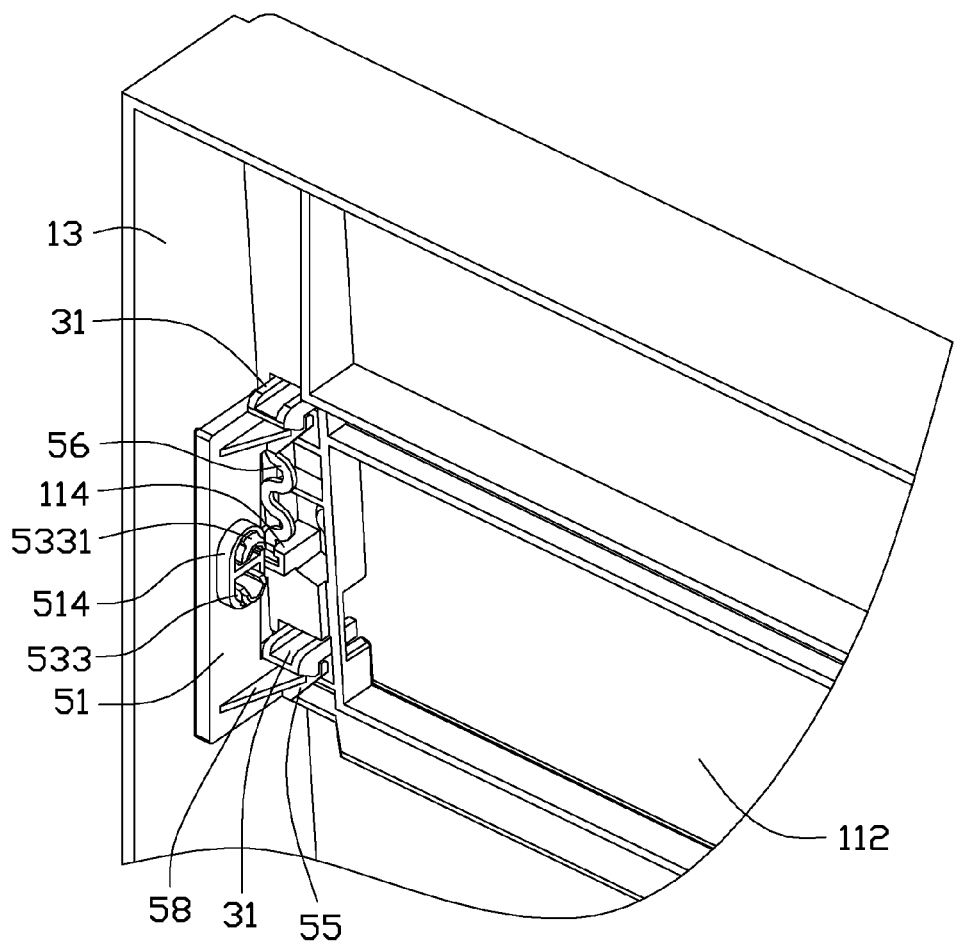
FIG. 5 is a similar to FIG. 4, but the securing member is located in a second position.

Referring to FIGS. 3-5, in assembly, the securing member 50 is located on the inner surface of the flange 13, and the securing panel 51 is located between the receiving portion 114 and the flange 13. The fixing block 561 is received in the receiving portion 114, and the resilient arm 56 is clipped into the cutout 1141. The resilient arm 56 is thus secured to the receiving portion 114. The fixing hole 512 is aligned with the retaining hole 131. The operating portion 53 is placed on an outer surface of the flange 13. The two clipping pieces 533 extend through the retaining hole 131 and are received in the fixing hole 512. The block 5331 of each of the two clipping pieces 533 is clipped to the clipping portion 514. Therefore, the operating portion 53 can be secured to the flange 13, with the separating portion 513 located between the two clipping pieces 533.

The securing member 50 can be positioned in a first position and a second position relative to the flange 13. In the first position, the fixing block 561 is located in a first end of the receiving portion 114 and adjacent to the cutout 1141, and each of the two clipping pieces 533 is located in a top end of each of the two parts of the fixing hole 512. In the second position, the resilient arm 56 is deformed or compressed, the fixing block 561 is located on a second end of the receiving portion 114 and away from the cutout 1141, and each of the two clipping pieces 533 is located on a bottom end of each of the two parts of the fixing hole 512.

The shielding member 30 abuts the main body 11. The two mounting portions 31 extend through the two through holes 115 and abut the first and the second connecting panels 54, 55, respectively. The positioning post 33 is engaged in the positioning hole 116. The shielding member 30 is pressed in a direction substantially perpendicular to the main body 11. The two mounting portions 31 urge the first and the second connecting panels 54, 55, respectively, to move the securing member 50 in a first direction substantially parallel to the flange 13. The first and the second connecting panels 54, 55 are moved in the first direction, to deform the resilient arm 56, until the securing member 50 is located on the second position. When the two mounting portions 31 extend through the first and the second connecting panels 54, 55, the resilient arm 56 is released. The securing member 50 is moved in a second direction opposite to the first direction, until the securing member 50 is located in the first position. Thereby, the first and the second connecting panels 54, 55 are engaged with the two mounting portions 31, respectively, to secure the shielding member 30 to the panel 10.

In disassembly, the operating panel 531 is operated in the first direction, to move the securing member 50 into the second position. The first and the second connecting panels 54, 55 are disengaged from the two mounting portions 31. The shielding member 30 is moved away form the panel 10 in a direction substantially perpendicular to the shielding member 30. The positioning post 33 is disengaged from the positioning hole 17, and the shielding member 30 can then be detached from the panel 10.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A bezel assembly comprising:
   a panel comprising a main body; the main body comprising a receiving portion and defining a through hole; the receiving portion comprising a receiving slot and a cutout communicating with the receiving slot;
   a shielding member attached to the panel and comprising a mounting portion; and
   a securing member comprising a resilient arm; the resilient arm abutting the receiving portion; a fixing block extending from a free end of the resilient arm; the resilient arm clipped in the cutout, and the fixing block received in the receiving slot;
   wherein the mounting portion extends through the through hole and is engaged with the securing member so that the shielding member is secured to the panel; to disengage the shielding member from the panel, firstly the securing member is moved in a first direction substantially parallel to the main body so that the resilient arm is deformed by the receiving portion, secondly the mounting portion is moved in a second direction substantially perpendicular to the first direction so that the mounting portion is disengaged from securing member.

2. The bezel assembly of claim 1, wherein the resilient arm is crooked, and the resilient arm is configured to be deformed when stretched.

3. The bezel assembly of claim 1, wherein the securing member comprises a securing panel and a connecting panel substantially perpendicular to the securing panel, and the connecting panel is connected to the resilient arm and engaged with the mounting portion.

4. The bezel assembly of claim 3, wherein the securing member further comprises an operating portion, the panel further comprises a flange, the flange defines a retaining hole, the securing panel comprising a fixing hole and a clipping portion surrounding the fixing hole, and the operating portion extends through the retaining hole and the fixing hole to engage with the clipping portion.

5. The bezel assembly of claim 4, wherein the operating portion comprises an operating panel and two clipping pieces, each of the two clipping pieces extending from the operating panel, the operating panel is adhered to an outer surface of the flange, the securing panel comprises a separating portion located in the fixing hole, the fixing hole is divided to two parts by the separating portion, and each of the two clipping pieces is received in each of the two parts and engaged with the clipping portion.

6. The bezel assembly of claim 3, wherein a cross-section of the connecting panel is a triangle.

7. The bezel assembly of claim 3, wherein a strengthening rib is connected to the securing panel and the connecting panel, and a cross-section of the strengthening rib is a triangle.

8. The bezel assembly of claim 1, wherein the shielding member comprises a positioning post, and the panel defines a positioning hole configured to receive the positioning post.

9. A bezel assembly comprising:
   a panel comprising a main body and a flange connected to the main body; the main body comprising a receiving portion and defining a through hole; the flange defining a retaining hole;
   a shielding member attached to the panel and comprising a mounting portion; and
   a securing member comprising a resilient arm, a securing panel, an operating portion, and a fixing blocking extending from a free end of the resilient arm; the resilient arm abutting the receiving portion;
   the securing panel comprising a fixing hole and a clipping portion surrounding the fixing hole, and the operating portion extending through the retaining hole and the fixing hole to engage with the clipping portion;
   wherein the mounting portion extends through the through hole and is engaged with the securing member so that the securing member is positioned in a first position or a second position relative to the flange; in the first position, the fixing block is located in a first end of the receiving portion; in the second position, the resilient arm is deformed, the fixing block is located in a second end of the receiving portion.

10. The bezel assembly of claim 9, wherein the resilient arm is crooked, and the resilient arm is configured to be deformed when stretched.

11. The bezel assembly of claim 9, wherein the receiving portion comprises a receiving slot and a cutout communicating with the receiving slot, the resilient arm is clipped in the cutout, and the fixing block in received in the receiving slot.

12. The bezel assembly of claim 9, wherein the securing member comprises a connecting panel substantially perpendicular to the securing panel, and the connecting panel is connected to the resilient arm and engaged with the mounting portion.

13. The bezel assembly of claim 12, wherein a cross-section of the connecting panel is a triangle.

14. The bezel assembly of claim 9, wherein the operating portion comprises an operating panel and two clipping pieces, each of the two clipping pieces extending from the operating panel, the operating panel is adhered to an outer surface of the flange, the securing panel comprises a separating portion located in the fixing hole, the fixing hole is divided to two parts by the separating panel, and each of the two clipping pieces is received in each of the two parts and engaged with the clipping portion.

15. The bezel assembly of claim 12, wherein a strengthening rib is connected to the securing panel and the connecting panel, and a cross-section of the strengthening rib is a triangle.

16. The bezel assembly of claim 9, wherein the shielding member comprises a positioning post, and the panel defines a positioning hole configured to receive the positioning post.

* * * * *